(12) United States Patent
Ueda et al.

(10) Patent No.: US 7,913,752 B2
(45) Date of Patent: Mar. 29, 2011

(54) COOLING DEVICE FOR VACUUM TREATMENT DEVICE

(75) Inventors: Masashi Ueda, Kanagawa (JP); Yoshimi Watabe, Kanagawa (JP); Shusaku Yamasaki, Kanagawa (JP); Kazuo Miyoshi, Tokyo (JP); Hiroyuki Otsuka, Kanagawa (JP)

(73) Assignee: Ishikawajima-Harima Heavy Industries Co., Ltd., Tokyo (JP)

( * ) Notice: Subject to any disclaimer, the term of this patent is extended or adjusted under 35 U.S.C. 154(b) by 0 days.

(21) Appl. No.: 10/546,045

(22) PCT Filed: Jan. 20, 2004

(86) PCT No.: PCT/JP2004/000424
§ 371 (c)(1),
(2), (4) Date: Aug. 17, 2005

(87) PCT Pub. No.: WO2004/073054
PCT Pub. Date: Aug. 26, 2004

(65) Prior Publication Data
US 2006/0144584 A1    Jul. 6, 2006

(30) Foreign Application Priority Data
Feb. 17, 2003   (JP) .................................. 2003-038052

(51) Int. Cl.
*F25B 29/00* (2006.01)
*H01J 37/32* (2006.01)
*H01L 21/00* (2006.01)

(52) U.S. Cl. ...... 165/275; 165/276; 165/80.1; 165/80.4; 165/96; 118/715; 118/725; 156/345.27; 156/345.52; 156/345.53; 204/298.07; 204/298.33

(58) Field of Classification Search ............... 165/272, 165/275, 276, 80.1, 80.2, 80.4, 80.5, 96, 165/274; 118/715, 725; 156/345.27, 345.52, 156/345.53; 204/298.07, 298.33
See application file for complete search history.

(56) References Cited

U.S. PATENT DOCUMENTS

| 4,480,284 A | * | 10/1984 | Tojo et al. | 361/234 |
| 4,768,352 A | * | 9/1988 | Maruyama | 165/80.4 |
| 5,220,171 A | * | 6/1993 | Hara et al. | 250/443.1 |
| 5,577,552 A | * | 11/1996 | Ebinuma et al. | 165/296 |

(Continued)

FOREIGN PATENT DOCUMENTS

EP    0 260 150 A2    3/1988

(Continued)

OTHER PUBLICATIONS

J. P. Holman, "Heat Transfer", 1976, McGraw-Hill, 4th Edition, p. 508.*

*Primary Examiner* — John K Ford
(74) *Attorney, Agent, or Firm* — Oblon, Spivak, McClelland, Maier & Neustadt, L.L.P.

(57) ABSTRACT

A cooling system for a vacuum processing apparatus is provided with an internal heat conduction path for transfer of heat entering the subject body through the vacuum processing apparatus, a heat radiation path for radiation of the heat to an outside of the vacuum processing apparatus and a heat conduction path for regulation of quantity of heat transfer between the internal heat conduction path and the heat radiation path. Preferably, a heat pipe is applied to the internal heat conduction path.

14 Claims, 7 Drawing Sheets

U.S. PATENT DOCUMENTS

| | | | | |
|---|---|---|---|---|
| 5,676,205 A | * | 10/1997 | White | 165/275 |
| 6,215,642 B1 | * | 4/2001 | Sogard | 361/234 |
| 6,899,789 B2 | * | 5/2005 | Tamura et al. | 156/345.53 |

FOREIGN PATENT DOCUMENTS

| | | |
|---|---|---|
| EP | 0 410 706 A2 | 1/1991 |
| EP | 0 410 706 A3 | 1/1991 |
| EP | 651424 | 5/1995 |
| EP | 0 260 150 A3 | 3/1998 |
| EP | 0 827 187 A2 | 3/1998 |
| EP | 0 827 187 A3 | 3/1998 |
| EP | 1073096 | 1/2001 |
| JP | 59-014633 | 1/1984 |
| JP | 59-19328 | 1/1984 |
| JP | 3-206613 | 9/1991 |
| JP | 5-315293 | 11/1993 |
| JP | 07-176601 | 7/1995 |
| JP | 08165572 A * | 6/1996 |
| JP | 09267036 A * | 10/1997 |
| JP | 11003893 A * | 1/1999 |
| JP | 11-233598 | 8/1999 |
| JP | 11233598 A * | 8/1999 |
| JP | 2000193376 A * | 7/2000 |
| JP | 2001-077040 | 3/2001 |
| JP | 2001168037 A * | 6/2001 |
| JP | 2001189373 A * | 7/2001 |

* cited by examiner

COOLING DEVICE FOR VACUUM TREATMENT DEVICE

TECHNICAL FIELD

The present invention relates to a cooling system for cooling a subject body to regulate a temperature of the subject body in the course of a surface treatment process utilizing vacuum.

BACKGROUND ART

To improve physical or chemical properties or add novel functions, various surface treatments on subject bodies utilizing vacuum are popularly practiced. As the surface treatments, film deposition, surface modification, surface nitriding, surface carbonization surface carburization, dry etching and such can be exemplified. The film deposition can be further categorized into two categories of so-called "Physical Vapor Deposition" (PVD hereinafter), in which film is grown under a physical process such as vacuum evaporation, and "Chemical Vapor Deposition" (CVD hereinafter), in which film is grown under a chemical process, in general. The surface treatments are processed with utilizing plasma in certain cases and CVD utilizing plasma is called "Plasma CVD".

The surface treatments utilizing vacuum employs vacuum processing apparatuses which have constitutions preferable to the respective treatments. FIG. 7 schematically shows a vacuum processing apparatus 100.

The vacuum processing apparatus 100 is provided with a chamber 102, the interior of which is evacuated and then applied to a surface treatment, and a cooling system 104. The apparatus may be further provided with a heater, not shown in the drawings, for supplementary heating of a substrate. The cooling system 104 absorbs heat entering the substrate via a heat absorption portion 104A. The absorbed heat is conducted via a heat transfer portion 104C to a heat release portion 104B as indicated by an arrow AR10. The heat release portion 104B is provided with a water-cooling jacket 104D and the heat is radiated thereby so that the substrate is cooled.

FIG. 8 is a schematic drawing of a vacuum processing apparatus 120 according to another example. It has a similar constitution as the aforementioned example though heat conduction in a cooling system 124 is done by means of a cooling medium circulating therein.

DISCLOSURE OF INVENTION

One of technical problems of the prior vacuum processing apparatuses 100 and 120 is properly regulating the temperature of the substrate. Supplied energy for surface treatment, such as heat injected into ingredient gases or plasma, may be changed as necessary and hence the heat entering the substrate is changed in each case. Radiation heat radiating to the substrate may also vary according to constitutions of auxiliary equipments housed in the chamber 102, and the same is true in a case of radiation heat radiating from the substrate. The temperature of the substrate depends on a balance among the aforementioned heats, the supplementary heat applied by the heater and heat drained by the cooling system 104.

In a case where the injected heat is relatively large, the supplementary heat by the heater comes to be nearly unnecessary so that the heater cannot effectively regulate the temperature of the substrate. On the other hand, the constitution of the cooling system 104 is difficult to change so as to modify the amount of heat draining therefrom. This leads to a complication of the constitution of the cooling system 104 so as to allow replacement of members thereof and further makes work in the replacement significantly laborious. More specifically, the prior vacuum processing apparatus has a problem of a deficiency in the controllability concerning with the substrate temperature.

The present invention is achieved in view of the above problem and intended for providing a cooling system for a vacuum processing apparatus, which can properly regulate a temperature of a subject body though simply constituted.

According to a first aspect of the present invention, a cooling system is provided with a heat pipe for transfer of heat entering a subject body which is treated with a vacuum treatment. Preferably the heat pipe is provided with a heat collection member. More preferably the heat collection member is surface-treated so as to have a larger radiation coefficient.

According to a second aspect of the present invention, a cooling system for a vacuum processing apparatus is provided with an internal heat conduction path for transferring heat entering a subject body, a heat release path for release of the transferred heat to an outside of the vacuum processing apparatus and a heat conduction path for regulation of quantity of heat transfer between the internal heat conduction path and the heat radiation path. Preferably, the heat conduction path is provided with a wall member, which isolates the inner heat conduction path and the heat radiation path so as to form a space, and a fluid regulation unit, which controllably fills a fluid for heat conduction into the space. More preferably, the fluid is gas. Further more preferably, the gas is one or more gases selected from a group of gases having high heat conduction coefficient. Still further preferably, the heat conduction path is so configured as to have 1/10 or less of the heat transfer quantity when the space is vacant compared with the heat transfer quantity when the space is filled with the fluid. Additionally preferably, the wall member is provided with an inner surface having a radiation coefficient of 0.7 or less. More preferably, an inner surface of the wall member is surface-treated so as to have a radiation coefficient of 0.7 or less. Further more preferably, the inner heat conduction path is provided with a heat pipe.

BEST MODE FOR CARRYING OUT THE INVENTION

Figure 1:
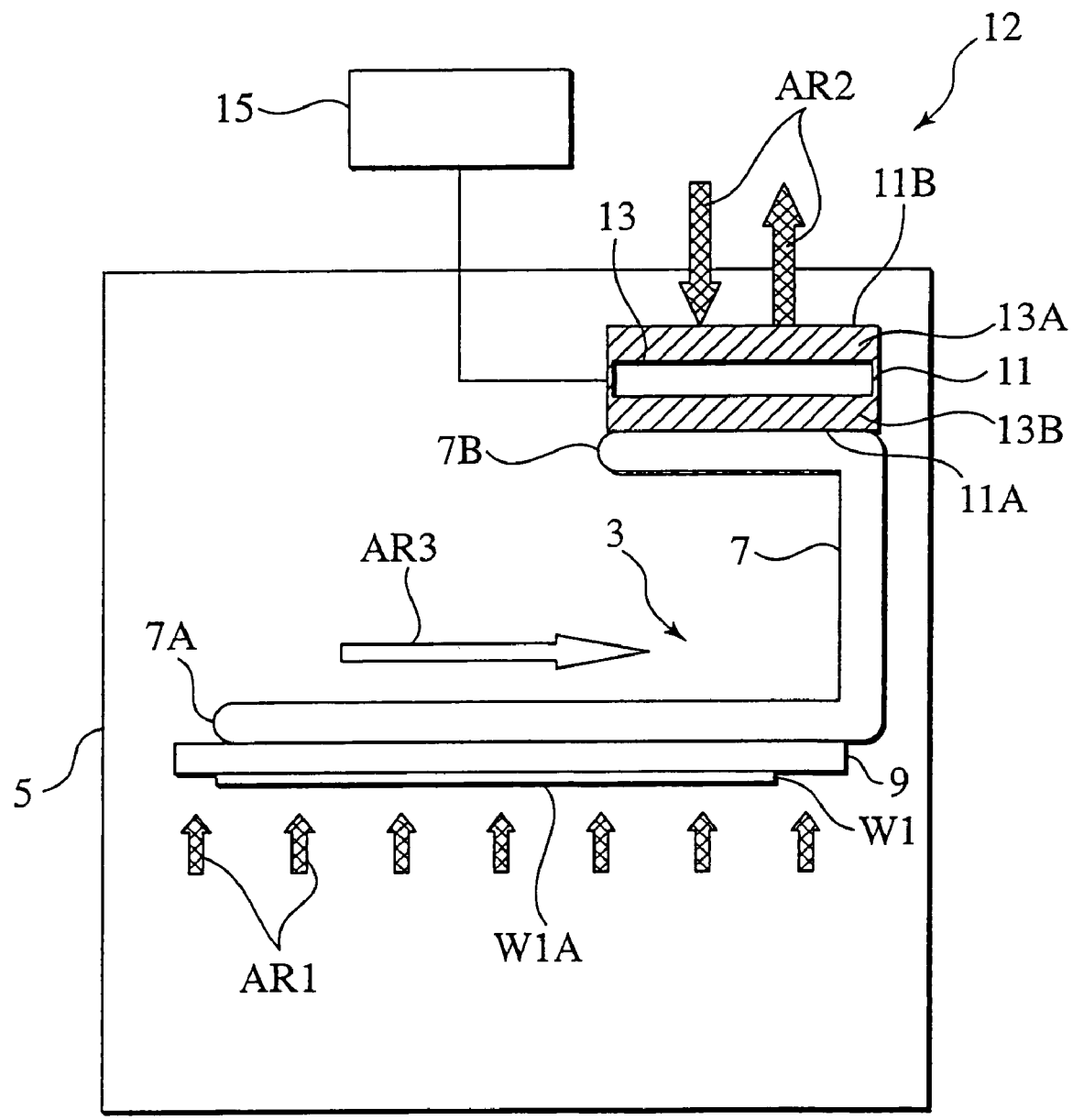
FIG. 1 is a schematic drawing of a cooling system and a vacuum processing apparatus according to a first embodiment of the present invention.

A first embodiment of the present invention will be described hereinafter with reference to FIG. 1. FIG. 1 shows a vacuum processing apparatus 1 preferably applied to a deposition of a thin film such as an a-Si film on a subject body formed in a plate like shape for example.

When depositing the thin film, a chamber 5 of the vacuum processing apparatus 1 includes ingredient gas in a depressurized state, for example, at less than 1000 Pa. Electricity is supplied thereto so as to generate plasma. A subject body W1 is closely attached to and supported by a holder 9 and receives heat input AR1 from the plasma. Against heating by the heat input AR1, the subject body W1 is cooled by the cooling system 3 so as to reach a proper temperature. To give preferable quality to the thin film deposited on the subject body W1, it is an important technical problem to properly regulate the temperature and control a state of the plasma.

The cooling system 3 is provided with an inner heat conduction path AR3 composed of a heat pipe 7 so as to conduct the heat AR1 received by the subject body W1. One end 7A of the heat pipe 7 is thermally connected to the holder 9 and the other end 7B is thermally connected to one end 11A of a cooling member 11. The holder 9 and the cooling member 11 are made of any material having high thermal conductivity such as metal so as to effectively conduct heat.

The cooling member 11 is further provided with a heat release path 12 connecting with an outside of the vacuum processing apparatus 1. Through the heat release path 12, a cooling medium such as cooling water flows as indicated by an arrow AR2 in FIG. 1. The heat received by the end 7A of the heat pipe 7 is conducted via the heat pipe 7 to the cooling member 11 and released from the heat release path 12.

Figure 2:
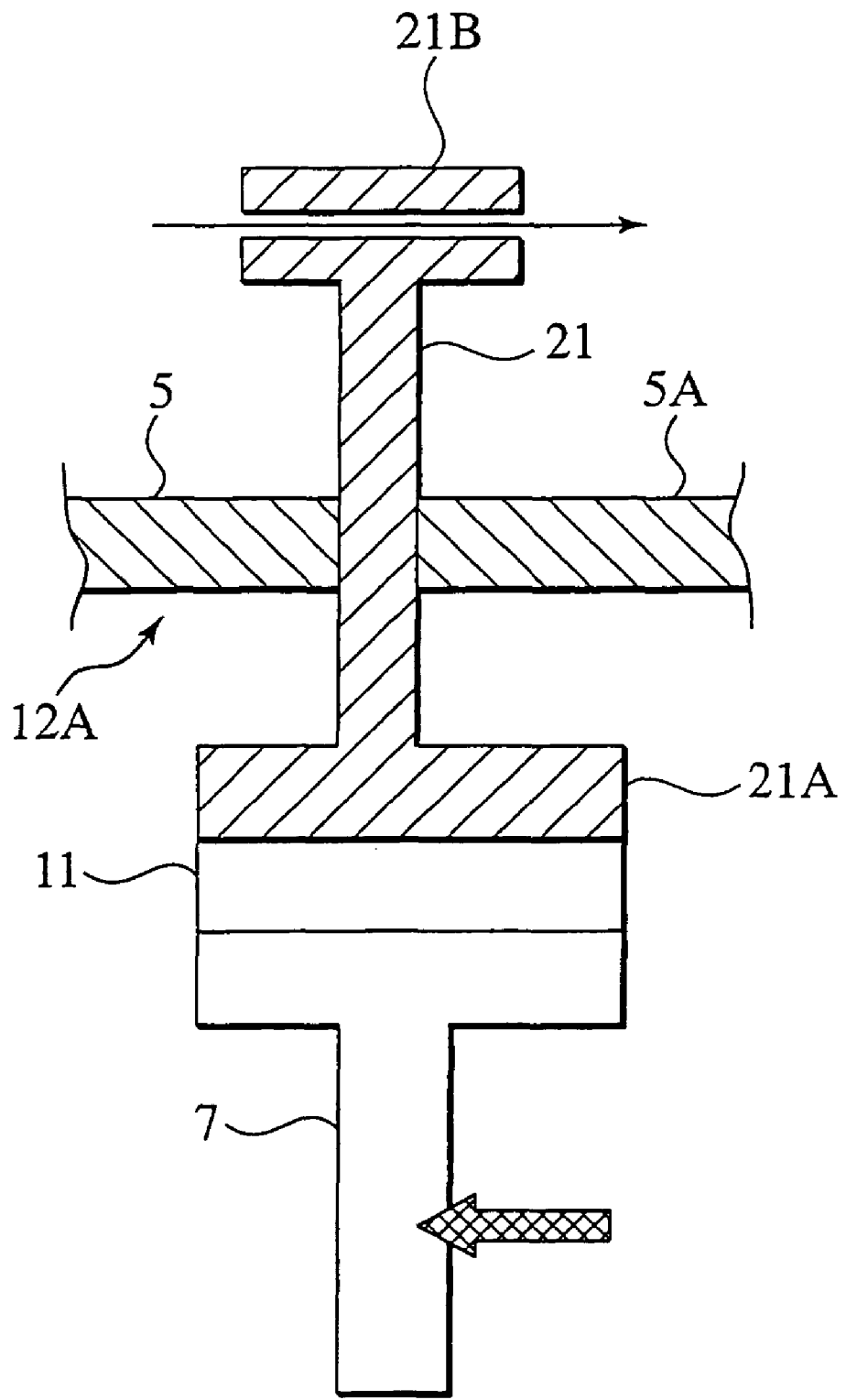
FIG. 2 is a schematic drawing of a heat radiation path according to a first modification of the first embodiment of the present invention.
Figure 3:
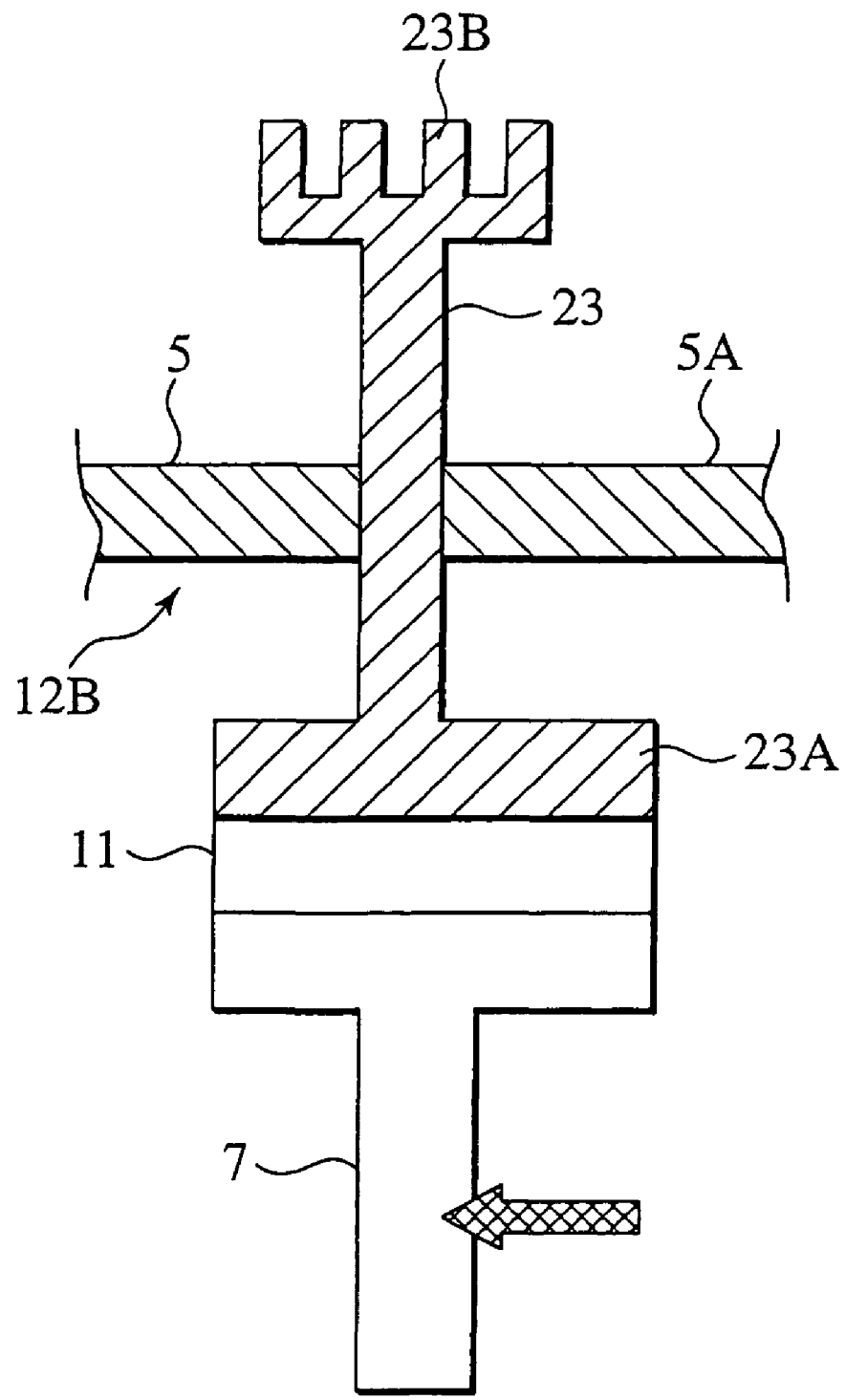
FIG. 3 is a schematic drawing of a heat radiation path according to a second modification of the first embodiment of the present invention.

Alternatively, the heat release path 12 can be constituted in accordance with a modified example shown in FIG. 2 or 3.

A heat release path 12A according to a first modification shown in FIG. 2 is provided with a heat transfer member 21 penetrating a vacuum partition wall 5A composing the chamber 5 of the vacuum processing apparatus 1. One end 21A of the heat transfer member 21 is thermally connected to the cooling member 11. The other end 21B is thermally connected to a cooling medium such as water, oil and such. The heat conducted from the subject body is conducted via the heat pipe 7 and the cooling member 11 to the end 21A and then extracted via the heat transfer member 21 by the cooling medium.

A heat release path 12B according to a second modification shown in FIG. 3 is provided with a heat transfer member 23 penetrating the vacuum partition wall 5A composing the chamber 5 of the vacuum processing apparatus 1. One end 23A of the heat transfer member 23 is thermally connected to the cooling member 11. The other end is provided with cooling fins 23B. The heat conducted from the subject body is conducted via the heat pipe 7 and the cooling member 11 to the end 23A and then radiated via the heat transfer member 23 by the cooling fins 23B.

According to any of the aforementioned modifications, a cooling medium for extraction of heat does not flow through the chamber 5. Thereby, when the thin film deposition is completed and hence cooling becomes unnecessary, possibility of unintended cooling of the interior of the chamber 5 by the cooling medium is reduced.

As shown in FIG. 1, the interior of the cooling member 11 is provided with a heat transfer space 13 which is partitioned and substantially closed by walls 13A and 13B. Such space functions as a control element such as a switch for heat conduction, which turns the heat conduction on and off, a heat conduction variable resistance for controlling quantity of the heat transfer and such may be added to the heat transfer space 13. Gas or liquid fluid is filled into the heat transfer space 13. The heat conducted from the heat pipe 7 is conducted via the heat transfer space 13, in which the fluid is filled, to the end 11B.

The heat transfer space 13 is thermally connected to a fluid control unit 15 from which the fluid is injected. The fluid control unit 15 controls an amount and/or a pressure of the fluid so as to function as a heat conduction switch which turns heat conduction on and off. Meanwhile, when the fluid control unit 15 is operated so as to control variation and/or the pressure of the fluid, the fluid control unit 15 can control the heat flow passing through the heat transfer space 13. In this case, the heat transfer space 13 functions as a variable resistance to heat conduction.

The quantity of the heat transfer between the walls 13A and 13B can be changed dependent on thermal conductivity, which is determined by the cross-sectional area and the length of the heat transfer space 13, the coefficient of heat conductivity and the pressure or the volume of the fluid filled therein.

In view of improvement of controllability of the heat flow, certain advantages are provided by the present invention in that a ratio of a heat transfer quantity when the heat transfer space 13 is filled with the fluid to a heat transfer quantity when the heat transfer space 13 is vacant is made larger. The heat transfer ratio is preferred to be smaller, preferably 1/10 or less and more preferably 1/20 or less, where the heat transfer ratio is defined as a ratio of a heat transfer quantity when the heat transfer space 13 is vacant to a heat transfer quantity when the heat transfer space 13 is filled with the fluid.

The heat transfer space 13 can be designed so that the heat transfer ratio is regulated to be an appropriate value by properly determining a gap d of the heat transfer space 13, the respective radiation coefficient $\epsilon_1$, $\epsilon_2$ of the wall member 13A, 13B and the thermal conductivity k of the fluid filled therein. Calculation of the heat transfer will be demonstrated hereinafter, in which the heat transfer quantity is calculated as a value divided by a unit area, namely, as a heat flux. For example, when the temperature of the wall member 13A is 150 degrees C. and the temperature of the wall member 13B is 200 degrees C., and provided that the gap d of the heat transfer space 13 is 2 mm and hydrogen gas (k=0.2 W/mK in approx.) is filled therein at an enough pressure, the heat flux is $k \times (200-150° C.)/d=5000$ W/m². Meanwhile, when the heat transfer space 13 is vacant, the heat flux can be calculated on the basis of proximity in which the heat is conducted only by radiation of the wall members 13A, 13B. Therefore, supposing the radiation coefficients $\epsilon_1 = \epsilon_2 = 0.4$, the heat flux becomes 250 W/m². Thus the heat transfer space 13 can be designed so that the heat transfer ratio is 1/20.

Figure 4:
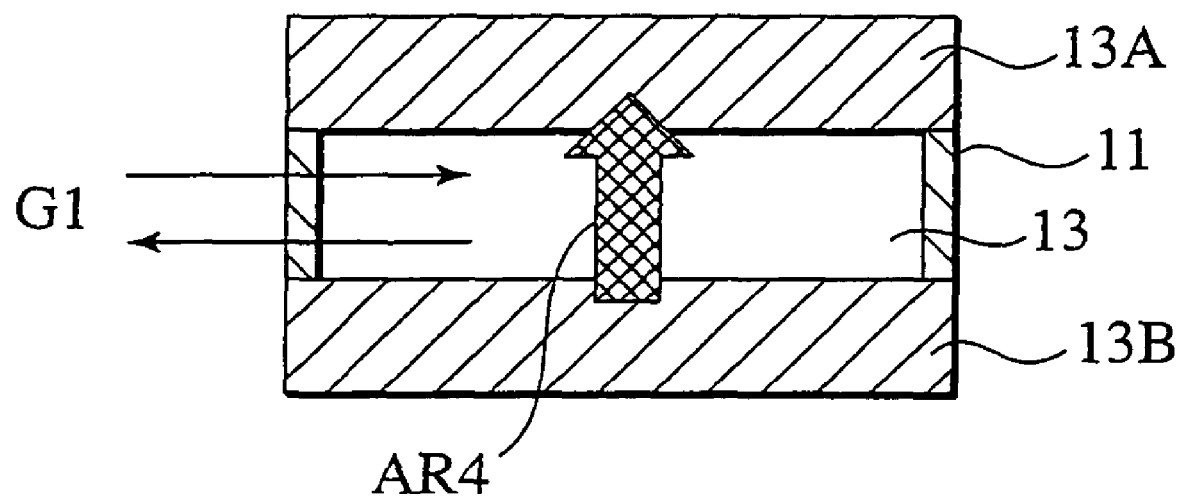
FIG. 4 is a constitution of a space for heat transfer of the cooling system according to the first embodiment of the present invention.

Either a gas or liquid can be applied to the fluid. FIG. 4 shows an example of a constitution to which a gas is applied.

Figure 5A:
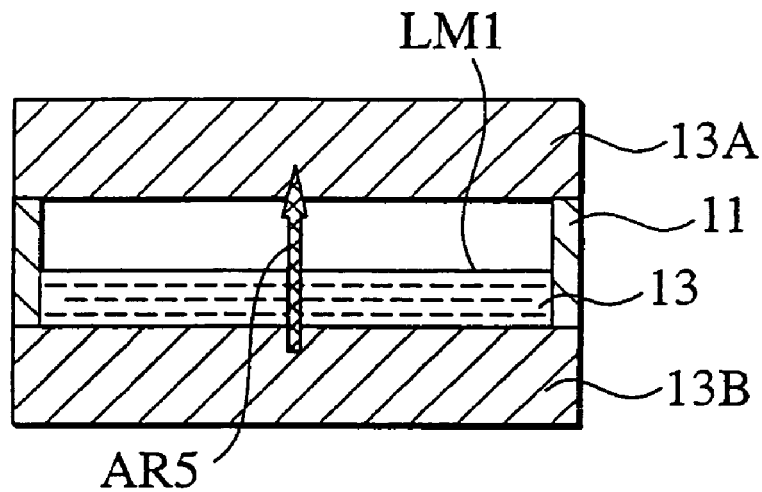
FIG. 5A is a constitution of a heat transfer space according to another embodiment, showing a state where liquid fills the heat transfer space halfway.
Figure 5B:
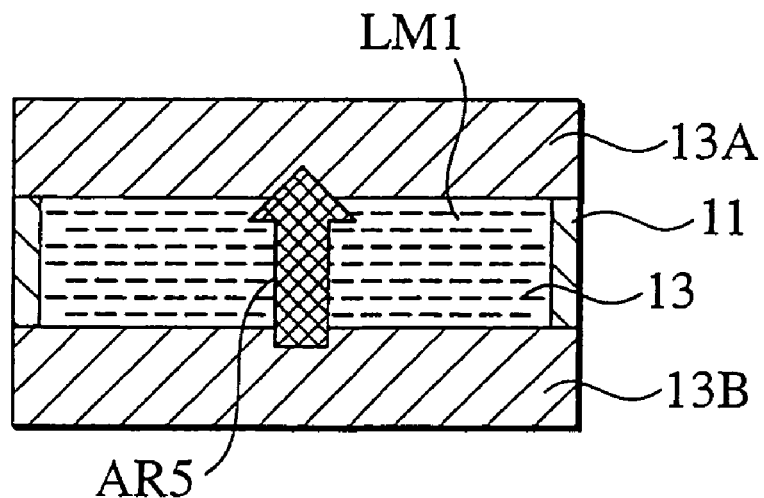
FIG. 5B is the heat transfer space of the aforementioned another embodiment, showing a state where liquid completely fills the heat transfer space.

The heat transfer space 13 is filled with gas supplied from the fluid regulation unit (gas regulation unit) 15. Any metal such as an In—Ga eutectic alloy, which is liquid at the working temperature, can be preferably applied to the fluid. In a case where the liquid incompletely fills the heat transfer space 13 as shown in FIG. 5A, the heat transfer becomes relatively low. In a case where the liquid completely fills the heat transfer space 13 as shown in FIG. 5B, the heat transfer becomes relatively high. Thereby switching the heat transfer or regulating the heat transfer quantity can be achieved by means of properly regulating the amount of the liquid filling the heat transfer space 13 with the fluid regulation unit 15.

Operation of the cooling system 3, in accordance with a case where thin film is deposited on a planar subject body W1 in the vacuum processing apparatus 1, will be described hereinafter. In the following description, an example in which the heat transfer space 13 is filled with hydrogen gas is given.

During depositing of a thin film, as shown by an arrow AR1 in the drawing, heat enters the subject body W1 in surface-contact with and supported by the holder 9. The entering heat is conducted via the holder 9 to the end 7A of the heat pipe 7 and further conducted via the heat pipe 7 to the other end 7B.

Subsequently the heat is conducted from the other end 7B to the end 11A of the cooling member 11 and further conducted to the hydrogen gas filling the heat transfer space 13. The heat is further conducted to the other end 11B of the cooling member 11 and cooled by a cooling medium shown as an arrow AR2.

When completing the thin film deposition, the hydrogen gas is removed from the heat transfer space 13 by means of the fluid regulation unit 15 so that the resistance of the heat transfer space 13 to the heat flux is increased.

Subsequently, before disposing the next subject body to the holder 9 in the chamber 5, the interior of the chamber 5 is heated to a temperature which is proper to the thin film deposition. The temperature of the holder 9 is immediately raised since the cooling system 3 is composed of the heat pipe 7 so as to have a small heat capacity and the resistance of the heat transfer space 13 to the heat flux is increased. Furthermore, because the resistance of the heat transfer space 13 to the heat flux is increased, even if the cooling medium shown as the arrow AR2 keeps flowing, the cooling medium is not detrimental to the temperature increase of the holder 9. Additionally, the cooling medium does not excessively cool the end 11A of the cooling member 11, thereby energy consumption in a standby state can be suppressed.

When the chamber 5 is heated to the proper temperature, the heat transfer space 13 is filled with hydrogen gas and the thin film deposition and the cooling are repeated.

According to the cooling system 3 of the first embodiment, the temperature of the subject body can be properly regulated with such a simple constitution. Because of the simple constitution, when performing maintenance of the vacuum processing apparatus 1, installation and removal of the cooling system 3 can be easily performed. Additionally the temperature of the subject body W1 can be immediately and properly regulated because the heat pipe 7 is employed.

Furthermore, because the efficiency of cooling can be regulated by means of proper regulation of the gas in the heat transfer space 13 by the fluid regulation unit 15, the temperature of the subject body can be properly regulated independently of heat quantity input to the subject body. Thereby the quality of the thin film can be improved.

Additionally, the holder 9 can be disposed in a vertical or slanted position though the holder 9 is disposed in a horizontal position according to the aforementioned cooling system 3, however, the cooling member 11 is preferably disposed in an upper position of the holder 9 because the heat pipe is suitable to heat conduction in a vertical direction.

In addition, in order to increase the resistance of the heat transfer space 13 to the heat flux, the pressure of the gas filled therein may be decreased so that so-called molecular flow state in which mean free path of the gas is larger than sizes of the heat transfer space 13 is obtained.

Moreover, to further increase the resistance of the heat transfer space 13 to the heat flux, the wall member 13A, 13B, at least the inner surfaces thereof, may be surface-treated so as to have a smaller radiation coefficient. As such surface-treatments, coating by means of plating, ion-plating and such, or surface finishing such as finishing so as to decrease surface roughness, buffing, electrolytic polishing and such are preferable. Lowering the radiation coefficient results in increasing controllability of the heat flux and hence the radiation coefficient is preferably 0.7 or less and more preferably 0.4 or less.

Figure 6:
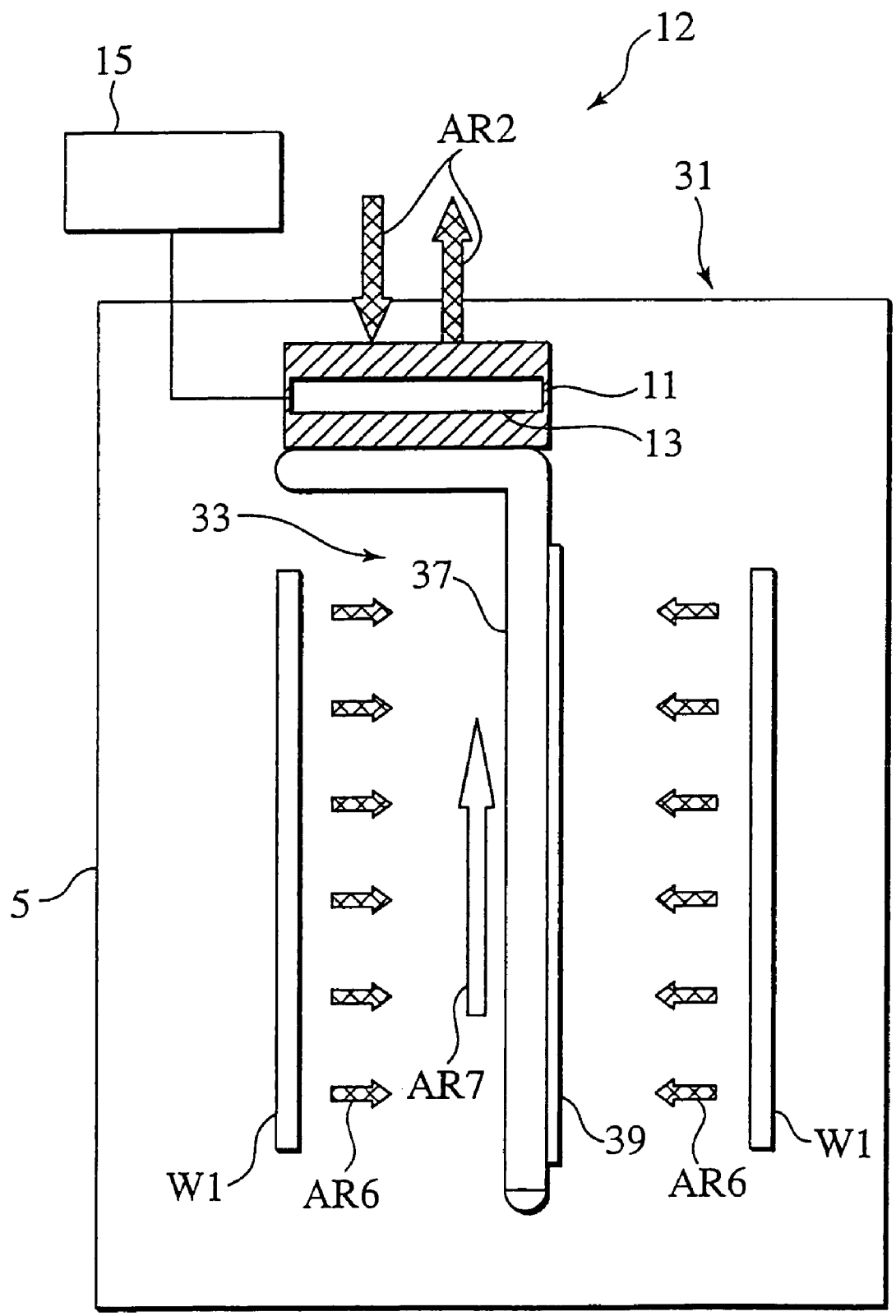
FIG. 6 is a schematic drawing of a cooling system and a vacuum processing apparatus according to a second embodiment of the present invention.
Figure 7:
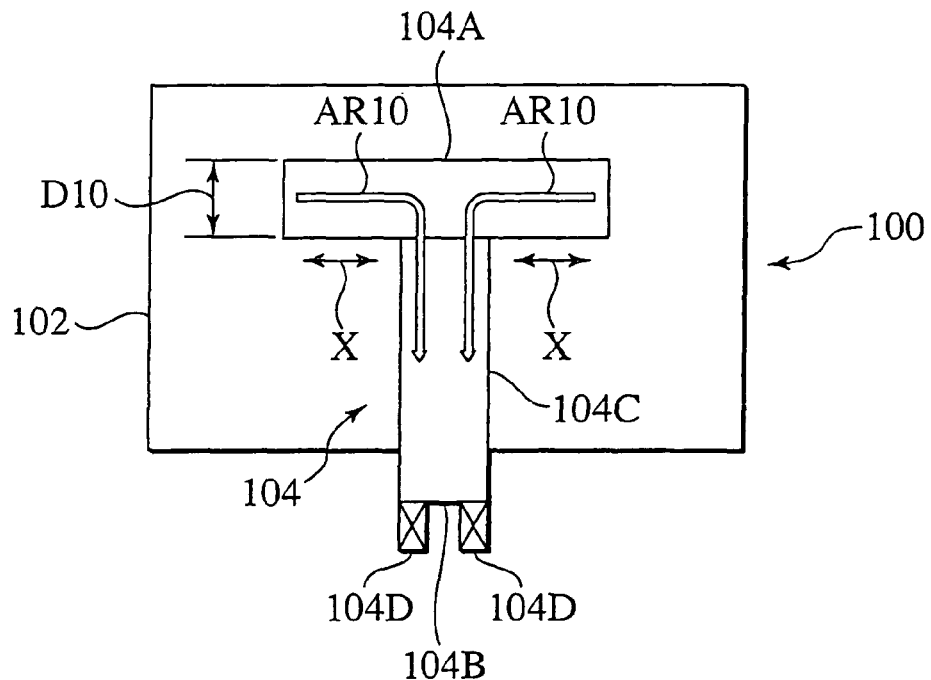
FIG. 7 is a schematic drawing of a cooling system and a vacuum processing apparatus according to a prior art.
Figure 8:
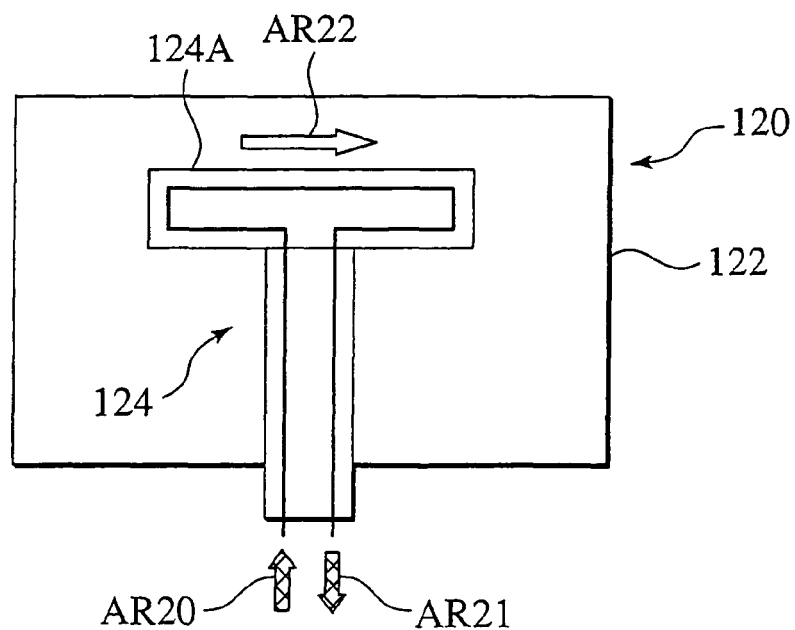
FIG. 8 is a schematic drawing of a cooling system and a vaccum processing apparatus according to another prior art.

A cooling system 33 and a vacuum processing apparatus 31 will be described hereinafter with reference to FIG. 6. Constituent elements substantially identical to the elements of the cooling system 3 and the vacuum processing apparatus 1 of the aforementioned first embodiment is referred to with the same reference numerals and the detailed description will be omitted.

According to the present embodiment, the subject body W1 is disposed distantly from a heat pipe 37. The heat pipe 37 is provided with a heat collection member 39 which is configured so as to effectively absorb heat AR6 by means of heat transfer and/or radiation via the gas in the vacuum processing apparatus 31.

For effective absorption of the heat AR6, the heat collection member 39 may be properly surface-treated so as to have a larger radiation coefficient. As such surface treatments, oxidation, nitriding, aluminum anodization, blasting, proper coating, spraying such as $Al_2O_3$, plating such as chromia, ceramics coating and such are preferable.

The subject body W1 and the heat collection member 39 are disposed in parallel with each other and in a vertical position.

The heat absorbed by the heat collection member 39 is conducted via the heat pipe 37 to the cooling member 11 and radiated as indicated by an arrow AR7 similarly to the aforementioned first embodiment.

The cooling system 33 of the present embodiment has the same effect as the cooling system 3 of the aforementioned first embodiment and has the additional effect of expanding the degrees of freedom of disposition because the subject body W1 is disposed distantly from the heat collection member 39. Furthermore, two of the subject bodies W1 may be simultaneously cooled.

Although the invention has been described above by reference to certain embodiments of the invention, the invention is not limited to the embodiments described above. Modifications and variations of the embodiments described above will occur to those skilled in the art, in light of the above teachings. For example, a planar subject body has been exemplified, however, any subject body of various shapes can be applied. Further, if necessary, the shapes of the holder and the heat collection member can be properly modified. Furthermore, the present invention can be applied to various vacuum processing apparatuses such as a dry-etching apparatus, a sputtering apparatus, a vacuum evaporation apparatus, a cat-CVD apparatus and the like, not limited to the plasma CVD apparatus.

INDUSTRIAL APPLICABILITY

The present invention provides a cooling for cooling a subject body, the temperature of which can be effectively regulated by a simple constitution.

The invention claimed is:
1. A cooling system for a vacuum processing apparatus, in which a subject body is treated with a vacuum treatment, the cooling system comprising:

an internal heat conduction path comprising a heat pipe, the internal heat conduction path transferring heat entering the subject body through the vacuum processing apparatus;

a heat release path configured to release the transferred heat to an exterior of the vacuum processing apparatus; and a heat conduction path configured to regulate quantity of heat transfer between the internal heat conduction path and the heat release path, the heat conduction path comprising a wall member and a fluid regulation unit, the wall member isolating the internal heat conduction path and the heat release path so as to form a space, the fluid regulation unit controllably filling a fluid for heat conduction into the space, wherein the heat release path comprises a solid heat transfer member with no internal fluid flow path penetrating a vacuum partition wall composing the vacuum processing apparatus, wherein a first end of the heat transfer member contacts the wall member and a second end of the heat transfer member is disposed outside of the vacuum processing apparatus and thermally connects with a cooling medium, wherein the heat pipe is elongated to have a first end thermally connected with the heat conduction path so as to conduct the transferred heat to the heat conduction path.

2. The cooling system of claim 1, wherein the internal heat conduction path includes a first end including a holder configured to hold the subject body so as to receive the heat entering the subject body, and a second end structurally and thermally linked with the heat conduction path.

3. The cooling system of claim 1, further comprising:
a heat collection member disposed in parallel with the subject body to receive and conduct the heat from the subject body by radiation to the internal heat conduction path.

4. The cooling system of claim 1, further comprising:
a holder configured to hold the subject body, the holder being linked with the internal heat conduction path.

5. The cooling system of claim 1, wherein the fluid comprises a fluid selected from the group of a gas and a liquid.

6. The cooling system of claim 1, wherein the heat conduction path is so dimensioned that the heat transfer quantity when the space is vacant is 1/10 or less of the heat transfer quantity when the space is filled with the fluid.

7. The cooling system of claim 1, wherein the cooling medium includes water or oil.

8. The cooling system of claim 1, wherein the heat conduction path is configured so that the heat transfer quantity when the space is vacant is 1/10 or less of the heat transfer quantity when the space is filled with the fluid.

9. The cooling system of claim 8, wherein the wall member comprises an inner surface having a radiation coefficient of 0.7 or less.

10. The cooling system of claim 8, wherein an inner surface of the wall member is surface-treated so as to have a radiation coefficient of 0.7 or less.

11. The cooling system of claim 1, wherein the fluid comprises gas.

12. The cooling system of claim 11, wherein the gas comprises one or more gases selected from a group of gases having high heat conduction coefficient.

13. The cooling system of claim 1, wherein the heat pipe further comprises a heat collection member.

14. The cooling system of claim 13, wherein the heat collection member is surface-treated so as to have a larger radiation coefficient.

* * * * *